United States Patent
Depew

(10) Patent No.: US 7,221,570 B2
(45) Date of Patent: *May 22, 2007

(54) HEAT DISSIPATING DEVICE FOR AN INTEGRATED CIRCUIT CHIP

(75) Inventor: John Mathew Depew, Sunnyvale, CA (US)

(73) Assignee: Apple, Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/269,961

(22) Filed: Nov. 8, 2005

(65) Prior Publication Data

US 2006/0056158 A1   Mar. 16, 2006

Related U.S. Application Data

(63) Continuation of application No. 10/843,533, filed on May 10, 2004, now Pat. No. 6,977,818.

(51) Int. Cl.
*H05K 7/20* (2006.01)

(52) U.S. Cl. ............ 361/719; 361/704; 361/707; 257/717; 257/718; 257/719; 165/80.3

(58) Field of Classification Search .......... 361/704, 361/707, 719; 257/706, 717–719, 727; 165/80.3, 185; 174/16.1, 16.3
See application file for complete search history.

(56) References Cited

U.S. PATENT DOCUMENTS

| | | | |
|---|---|---|---|
| 5,621,615 A * | 4/1997 | Dawson et al. ............ 361/704 |
| 5,706,171 A * | 1/1998 | Edwards et al. .......... 361/705 |
| 5,710,459 A | 1/1998 | Teng et al. |
| 5,787,576 A | 8/1998 | Warren et al. |
| 5,985,697 A * | 11/1999 | Chaney et al. ............ 438/122 |
| 6,025,991 A * | 2/2000 | Saito ........................ 361/704 |
| 6,218,730 B1 * | 4/2001 | Toy et al. .................... 257/704 |
| 6,301,107 B1 | 10/2001 | Lev et al. |
| 6,496,373 B1 | 12/2002 | Chung |
| 6,562,655 B1 | 5/2003 | Glenn et al. |
| 6,570,764 B2 * | 5/2003 | Bhatia et al. ............... 361/705 |
| 6,657,296 B2 | 12/2003 | Ho et al. |
| 6,706,562 B2 * | 3/2004 | Mahajan et al. ............ 438/125 |
| 6,740,972 B2 * | 5/2004 | Smith et al. ................ 257/746 |
| 6,750,551 B1 * | 6/2004 | Frutschy et al. ............ 257/785 |
| 6,767,765 B2 * | 7/2004 | Chiu ........................... 438/122 |
| 6,836,408 B2 * | 12/2004 | Gektin et al. ............... 361/704 |
| 6,837,306 B2 * | 1/2005 | Houle et al. ................ 165/185 |
| 6,870,246 B1 * | 3/2005 | Mullen et al. .............. 257/678 |
| 6,891,259 B2 * | 5/2005 | Im et al. ..................... 257/687 |
| 6,936,919 B2 * | 8/2005 | Chuang et al. ............. 257/717 |
| 7,023,699 B2 * | 4/2006 | Glovatsky et al. .......... 361/704 |
| 2001/0033476 A1 * | 10/2001 | Dibene et al. .............. 361/702 |
| 2002/0105071 A1 * | 8/2002 | Mahajan et al. ............ 257/720 |
| 2003/0085453 A1 * | 5/2003 | Eyman et al. .............. 257/678 |

(Continued)

*Primary Examiner*—Boris Chervinsky
(74) *Attorney, Agent, or Firm*—Blakely, Sokoloff, Taylor & Zafman LLP

(57) ABSTRACT

An electronic assembly comprises a support board, an integrated circuit chip interconnected and coupled to the support board, and a thermal-gap-filler pad placed over the integrated circuit chip and in contact with an external device to dissipate heat generated by the integrated circuit chip. The electronic assembly further comprises a standoff structure disposed adjacent the thermal-gap-filler pad and coupled to the support board, the standoff structure configured to prevent excessive force from being applied onto the thermal-gap-filler.

33 Claims, 6 Drawing Sheets

U.S. PATENT DOCUMENTS

| | | | |
|---|---|---|---|
| 2003/0117775 A1* | 6/2003 | Vrtis et al. | 361/705 |
| 2003/0122242 A1* | 7/2003 | Takeuchi | 257/697 |
| 2004/0095727 A1* | 5/2004 | Houle | 361/704 |
| 2004/0164402 A1* | 8/2004 | Yoshimura | 257/706 |
| 2004/0218354 A1* | 11/2004 | Lee et al. | 361/687 |
| 2006/0043553 A1* | 3/2006 | Yang et al. | 257/678 |

* cited by examiner

HEAT DISSIPATING DEVICE FOR AN INTEGRATED CIRCUIT CHIP

This application is a continuation application of U.S. patent application Ser. No. 10/843,533, filed May 10, 2004 now U.S. Pat. No. 6,977,818.

FIELD

Aspects of the present invention pertain to heat dissipating methods and devices.

BACKGROUND

Advances continue to be made in the manufacture of solid-state electronic devices, resulting in increasing functionality, density, and performance of the integrated circuits (ICs). The amount of heat generated, and accordingly the amount of power needed to be dissipated, by modem integrated circuits generally increases with increases in the density and speed of the circuits. Removal of heat produced by the integrated circuits therefore continues to be of significant concern of modem integrated circuit package and system designers, considering the loss of performance and the degradation in reliability of integrated circuits when operated at elevated temperatures.

In addition, the trend toward more compact electronic systems is also continuing, exacerbating the thermal problem produced by the high-complexity and high-performance integrated circuits. For example, laptop or notebook sized computers have recently become quite popular, with continuing market pressure toward even smaller computer systems such as personal digital assistants (PDA). However, these small computer systems eliminate many of the traditional techniques for heat removal available for large-scale computer systems, such as the use of fans for convection cooling of the integrated circuits. As such, many modem computer systems utilize thermal conduction as the primary mode of heat removal from the integrated circuits in the computer system.

Compact electronic products that utilize high-density ICs or similar electronic components may utilize thermal gap filler (a material with high thermal conductivity in a conformable pad-like form) as a way to cool off the ICs and maintain proper ICs' operating junction temperature. The thermal gap filler is adhered to the ICs on one side of the thermal gap filler and contacted to an exterior case of the device that houses the ICs on the other side of the thermal gap filler. The thermal gap filler allows self-generated heat (from the ICs) to be dispersed into the exterior case of the device that houses the ICs without the cost, weight, or size considerations of heat sinks or heat-pipes.

There are disadvantages to the technique mentioned above. By physically coupling the exterior case of the device that house the ICs to the thermal gap filler to transfer heat from the IC through the filler and to the exterior case, a situation is now present whereby an externally applied force to the device's exterior case can damage the IC and/or the filler. The externally applied force can be generated by routine handling, touching, operating, or abusing of the device. This externally applied force will directly induce a mechanical force and/or physical stress on the device thermal gap filler and the ICs. In certain cases, depending upon the physical characteristics of the product, this force could exceed the maximum physical stress capability of the ICs' mechanical interface with the device's system, either with the device's logic board, or within the ICs themselves. Additionally, this force could exceed the stress that the thermal gap filler can handle or optimally handle. Excessive force and stress can thus be caused to the ICs and/or the thermal gap filler and as such would inevitably cause catastrophic product or device failure.

As processors and power devices get faster and hotter, and as package densities increase, the need for reliable, effective, and efficient thermal management devices become crucial. Thus, there is a need for a heat-dissipating device that can dissipate heat generated from an IC or ICs without the risk of damaging either the ICs or the heat-dissipating device itself.

SUMMARY

Thermal gap fillers are used to transmit heat generated from an IC or ICs to their external housing. Thermal gap filler in a pad format is placed in contact with the external housing and heat is dissipated to the external housing. Mechanical forces applied to the housing may distort and damage the thermal gap fillers as well as the ICs and the ICs' associated interconnection. A support structure having a standoff feature is provided to limit the external mechanical force applied to the thermal gap fillers as well as the ICs and the ICs' associated interconnection.

One aspect of the invention pertains to a heat-dissipating device for an integrated circuit chip. The heat-dissipating device comprises a thermal-gap-filler pad constructed to be coupled to an integrated circuit on one surface of the thermal-gap-filler pad and contacted to an external device on another surface of the thermal-gap-filler pad. The thermal-gap-filler pad dissipates heat generated from the integrated circuit chip to the external device. The heat-dissipating device also comprises a support frame disposed adjacent (e.g., around or near or within) the thermal-gap-filler pad. The support frame has a standoff feature to prevent excessive force from being applied onto the thermal-gap-filler pad. The standoff feature limits the travel distance of the external device thus limiting excessive force on the thermal-gap-filler pad.

One aspect of the invention pertains to an electronic assembly that comprises a support board, an integrated circuit chip interconnected and coupled to the support board, and a thermal-gap-filler pad placed over the integrated circuit chip and in contact with an external device to dissipate heat generated by the integrated circuit chip. The electronic assembly further comprises a standoff structure disposed adjacent the thermal-gap-filler pad and coupled to the support board, the standoff structure constructed to prevent excessive force from being applied onto the thermal-gap-filler.

Another aspect of the invention pertains to a computer system that incorporates a thermal-gap-filler pad and a support structure. The computer system comprises a main logic board, a plurality of interconnection contacts placed on the main logic board, and an integrated circuit chip interconnected to the main logic board and coupled to the main logic board. A thermal-gap-filler pad is placed over the integrated circuit chip and in contact with an enclosure case to dissipate heat generated by the integrated circuit chip. A standoff structure is disposed adjacent the thermal-gap-filler pad and coupled to the main logic board. The standoff structure is constructed to prevent excessive force from being applied onto the thermal-gap-filler pad.

Another aspect of the invention pertains to a method for dissipating heat from an integrated circuit chip. The method comprises placing a thermal-gap-filler pad over an integrated circuit chip that is coupled to a support board, and placing a support structure around the thermal-gap-filler pad and the integrated circuit chip. The method further comprises placing an external device over the thermal-gap-filler pad. The support structure includes a standoff feature that prevents excessive force applied onto the thermal-gap-filler pad while allowing sufficient contact between the thermal-gap-filler pad and the external device.

DETAILED DESCRIPTION

Figure 1:
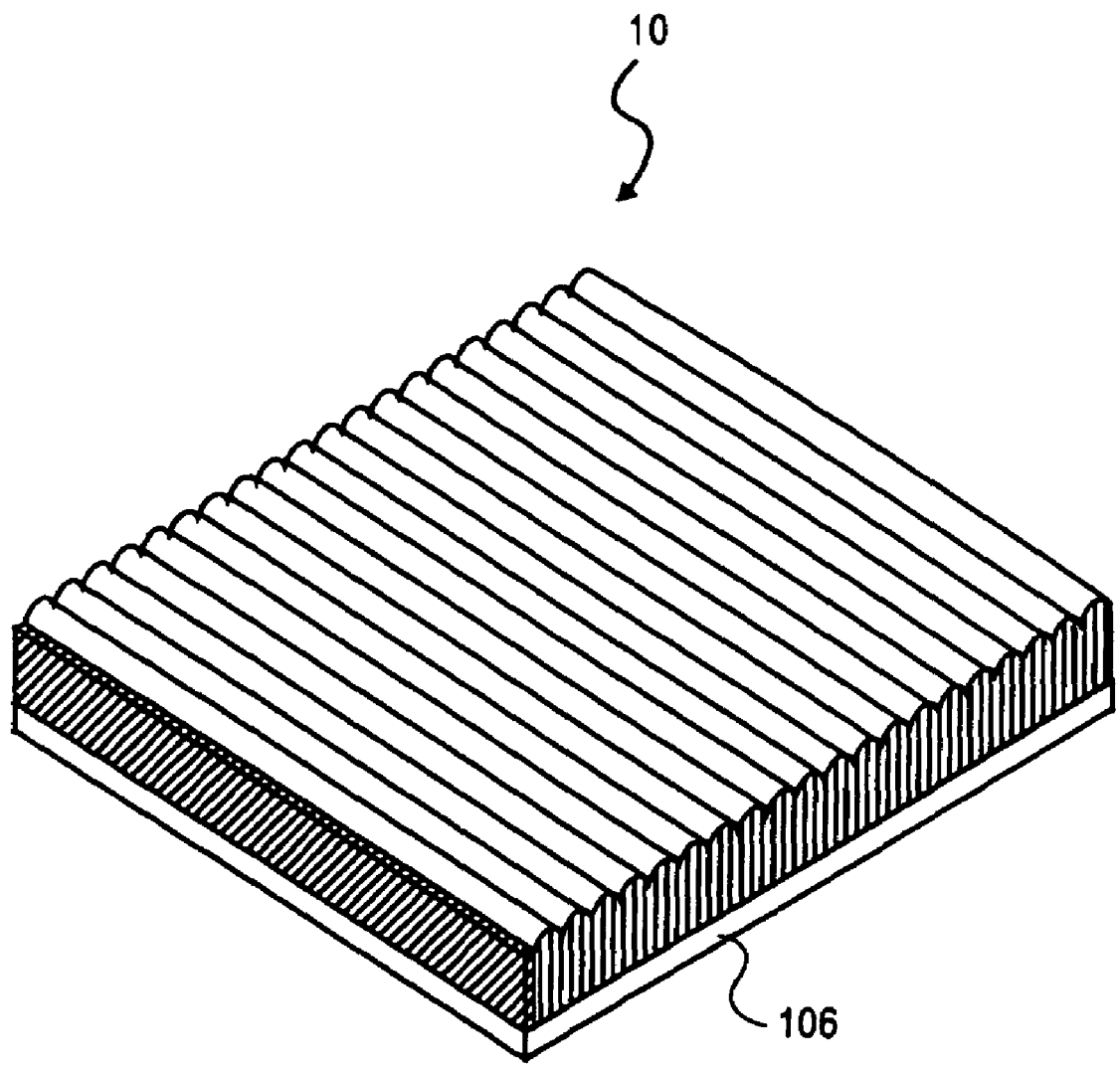
FIG. 1 illustrates a exemplary thermal-gap-filler (TGF) pad that can be used for several embodiments of the present invention.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Embodiments of the present invention pertain to a heat dissipating structure for an IC chip(s) utilizing a thermal-gap-filler (TGF) pad and a supporting structure that is capable of preventing or limiting excessive mechanical force applied to the TGF pad, the IC chips, and the chips' associated interconnections. In particular, the embodiments combine a TGF pad with a support structure to dissipate heat produced or generated by an IC chip or multiple IC chips while limiting excessive applied mechanical force to the TGF pad and the chips and the chips' associated interconnections. These embodiments thus allow the integrity and functionality of the TGF pad to be optimized and preserved for effectively dissipating heat from the IC chips without the potential of damaging the TGF pad, the IC chip, and the IC chips' associated interconnections.

One embodiment pertains to a heat-dissipating device that includes a TGF pad protected by a support structure. The TGF is configured to be placed on top of the IC chip to be cooled (e.g., via adhesive or conductive adhesive). The support structure is typically placed around the TGF pad although alternative placements such as within the TGF pad are also possible. It is preferable that that support structure rest on a logic board and not the IC, and if the pad is larger than the IC, a support structure may be enclosed within an opening of the TGF pads, which opening is not over the IC. The TGF pad is also constructed to be placed in contact with an external device (e.g., an external housing or a computer cover case) to transfer heat from the IC chip to the external device. In one embodiment, one surface of the TGF pad is placed over the IC chip and one surface of the TGF pad is placed in contact with the external device. The support structure includes a standoff feature that prevents excessive mechanical force from being applied to the IC chip and the TGF pad. In one embodiment, the support structure has a height that is less than the total stack-up height of the IC chip plus the TGF pad to ensure proper engagement between the TGF pad and the external device. The standoff feature protrudes from the surface of the support structure to prevent the external device from pressing down excessively on the TGF pad and exerts excessive mechanical force on the TGF pad and the IC chip. In one embodiment, the support structure is configured to allow the TGF pad to be depressed or deflected by about less than 30% (optimally 20%) for an efficient heat transfer. An excessive mechanical force would be a force that will cause the TGF pad to deflect or depress more than optimally needed for an efficient heat transfer (e.g., less than about 30% (optimally 20%)). In one embodiment, the mechanical force is generated as the external device is pressed against the TGF pad during handling of the external device.

FIG. 1 illustrates an exemplary TGF pad 10 that can be used for various embodiments of the present invention. Thermal gap fillers are used to conduct heat across an air gap, from a hot device (such as a processor, an IC, or an Application Specific IC, ASIC) to heat rail, spreader, or chassis, which may be used in enclosures with restricted convection and insufficient room for conventional heat sinks. For instance, thermal gap fillers are used in dissipating heat generated from an IC chip such as a graphics controller IC in a notebook computer where space is extremely limited. The thermal gap fillers typically include thermally conductive ceramic filler particles dispersed in a conformable and form-stable polymer binder forming a TGF pad 10 as shown in FIG. 1. This figure also shows the TGF pad 10 adhered to an IC chip 106 using methods known in the art. For example, the TGF pad 10 can be coupled to the IC chip 106 using adhesive or heat conductive adhesive as is well known in the art. An example of a commercially available TGF pad 10 is Therma-A-Gap A574 made by Chomerics, Marlow, and Buckinghamshire, UK. In one embodiment, the TGF pad 10 is constructed to have a size and/or shape similar to the IC chip (or other devices) that needs heat dissipation so that the TGF pad 10 can effectively cover substantially all area of the IC chip (see FIG. 1). For instance, when the IC chip has a rectangular shape of a certain dimension, the TGF pad 10 also has a rectangular shape of similar dimension. The TGF pad may extend beyond the edges of the IC such that the TGF pad has a larger area than the IC.

Figure 2:
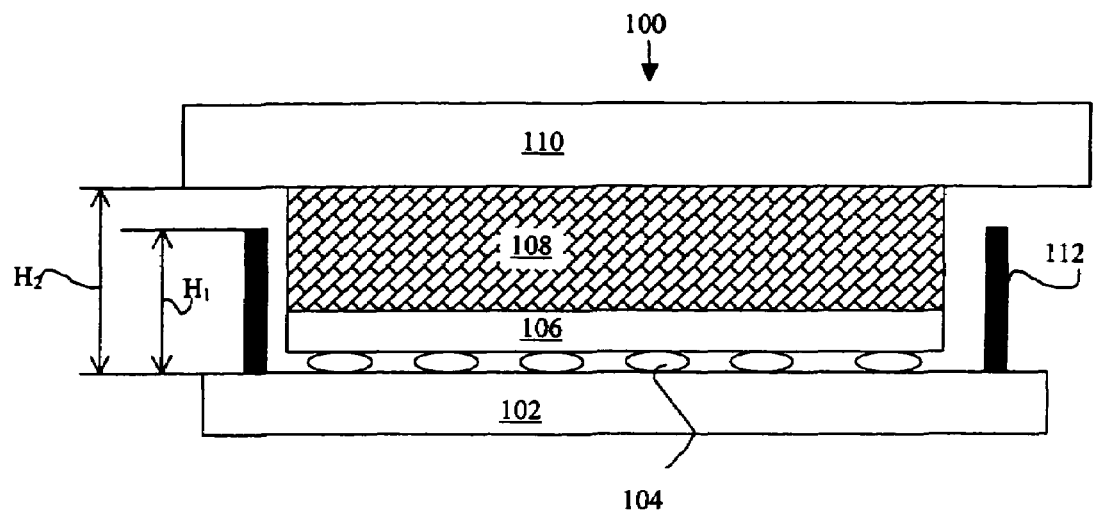
FIG. 2 illustrates a sectional view of an exemplary embodiment of a TGF pad coupling to an IC chip and protected by a support structure.

FIG. 2 illustrates an exemplary embodiment where a heat-dissipating device is incorporated into an electronic assembly 100. In one embodiment, the electronic assembly 100 is a computer or a notebook computer that includes at least one IC chip that can be cooled using a TGF pad. The TGF pad cools the IC chip by transferring the heat generated by the IC chip to an external surface, e.g., an enclosure case of the computer. The electronic assembly 100 includes a support board 102 (e.g., a printed circuit board such as a motherboard or a graphics controller board) upon which is placed a plurality of interconnection pads (e.g., solder balls) 104. An IC chip 106 is coupled to the support board 102 via the interconnection pads 104. In one embodiment, the support board 102 is a main logic board of a computer that the IC chip 106 needs to communicate to. The support board 102 is configured to be able to withstand a much higher mechanical force than the IC chip 106. In one embodiment, the IC chip 106 is a graphics controller chip configured to control the graphics display of a computer's display apparatus. A TGF pad 108 is fixedly adhered on top of the IC chip 106 using methods known in the art (e.g., using conductive or non-conductive adhesive). A support structure 112 is placed around the TGF pad 108 and the IC chip 106 to limit the mechanical forced applied to the TGF pad 108 and the IC chip 106. As shown in FIG. 2, the TGF pad 108 is placed in contact with an external device 110, which in one embodiment, is a computer enclosure case. The external device 110 is made of a material that not only can protect the components within the case, but also can accept the heat transferred from the IC chip 106 via the TGF pad 108 to dissipate the heat. Such a material includes but is not limited to plastic and metal and any combination thereof.

In one embodiment, the support structure 112 has a height $H_1$ that is less than the total stack-up height $H_2$ of the IC chip 106 (and its associated interconnection 104 pads) plus the TGF pad 108 to ensure proper engagement or contact between the TGF pad 108 and the external device 110. The TGF pad 108 needs to contact the external device 110 to dissipate the heat into the external device 110. Thus, the support structure 112 needs to be constructed to allow such a contact while limiting excessive mechanical force onto the TGF pad 108. The support structure 112 is coupled to the support board 102 so that excessive mechanical force from the external device 110 is deferred onto the support board 102 and not the TGF pad 108 or the IC chip 106. The support structure 112 can be made out of a rigid and insulated material such as plastic or ceramic to name a few possible materials.

In one embodiment, the support structure 112 includes a standoff feature that protrudes from the surface of the support structure 112 to prevent the external device 110 from pressing down excessively on the TGF pad 108 and exerts excessive mechanical force on the TGF pad 108 and the IC chip 106. As shown in FIG. 2, the standoff feature can be vertical posts placed around the TGF pad 108 and the IC chip 106. In one embodiment, there are at least two vertical posts placed oppositely from each other. More than two vertical posts (e.g., three or four) can be used for better stability and ability to limit the mechanical force from the external device 110. Alternatively, the standoff feature can also be a continuous ring that protrudes from the surface of the support structure 112. Alternatively, the standoff feature can simply be the support structure 112 itself and forms a continuous ring or frame around the TGF pad 108 and the IC chip 106 in a way that when the external device 110 presses down on the TGF pad 108, excessive mechanical force is limited or controlled. The support structure 112 thus limits the travel distance of the external device 110 while allowing sufficient contact between the external device 110 and the TGF pad 108.

Figure 3:
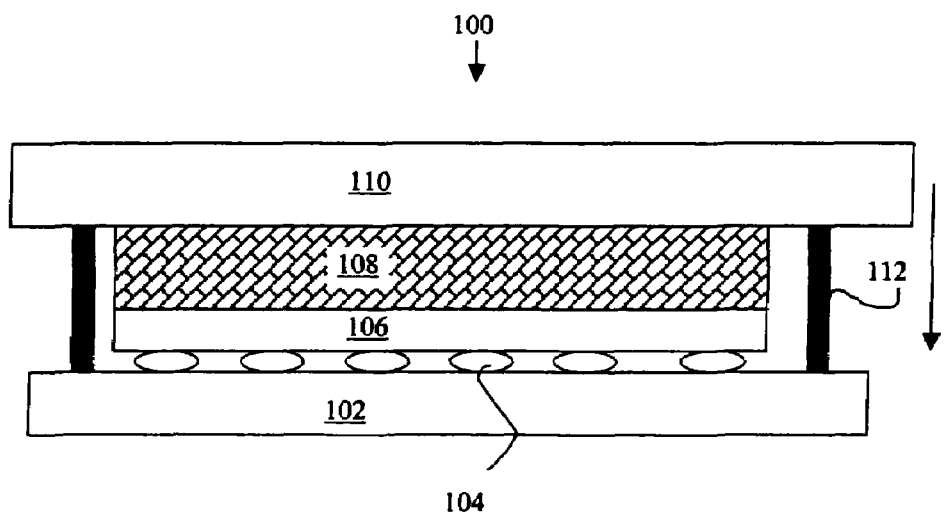
FIG. 3 illustrates a sectional view of the support structure shown in FIG. 2 limiting excessive mechanical force onto the TGF pad and the IC chip.

It is to be noted that for efficient and optimal heat transferring, the TGF pad 108 needs to make contact to the external device 110 while being depressed or deflected by less than 30% (optimally about or less than 20%). Thus, as shown in FIG. 3, the external device 110 can press down to create the necessary contact to the TGF pad 108 and cause the depression in the TGF pad 108. The TGF pad may be resilient such that it returns to it normal height after being depressed or deflected by an external force which is removed.

FIG. 3 further illustrates how the support structure 112 can be constructed to limit the mechanical force applied to the TGF pad 108 and the IC chip 106. As the external device 110 deflects or moves down due to a force (or local force) applied to the external device 110 (e.g., caused by handling, holding, or mishandling), the support structure 112's standoff feature (e.g., vertical posts) prevents the external device 110 from applying an excessive mechanical force on the TGF pad 108 and on the IC chip 106. In one embodiment, the support structure 112 is configured to allow the TGF pad 108 to depress or deflect by about or less than 20% or less than 30% for an efficient heat transfer. An excessive mechanical force would be a force that will cause the TGF pad 108 to deflect or depress more than optimally needed for an efficient heat transfer (e.g., more than 30%). It is to be noted that different types of TGF pad 108 require different values of depression and can withstand different amounts of mechanical force before the TGF pad 108 is damaged or before the TGF pad 108 transfers the force onto the IC chip 106 below and causes damage to the IC chip 106 or the chip's associated interconnections. The support structure 112 is thus constructed such that it will prevent an excessive force from being applied onto the particular TGF pad 108 in a way that will preserve the functionality and/or integrity of the TGF pad 108. The support structure 112 is also constructed to prevent an excessive force to be applied to the IC chip 106 and its associated interconnections such as the interconnection pads 104.

Figure 4:
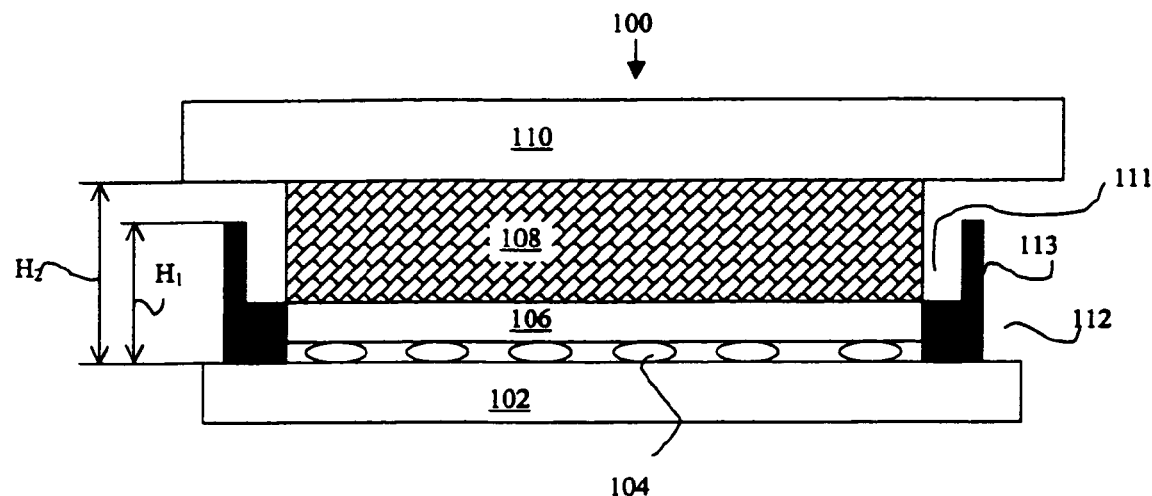
FIG. 4 illustrates a sectional view of another exemplary embodiment of a TGF pad coupling to an IC chip and protected by a support structure.

FIG. 4 illustrates an alternative embodiment for a support structure 112. The electronic assembly shown in this figure is similar to the electronic assembly 100 shown in FIGS. 2–3 except for the variation in the support structure 112. The support structure 112 shown here includes a frame 111 and a standoff feature 113. The frame 111 provides a protective ring around the TGF pad 108 and the IC chip 106. The standoff feature 113 protrudes off the surface of the frame 111 and is able to limit the travel distance of the external device 110. The standoff feature 113 can also be an offset feature on top of the frame 111.

In one embodiment, the support structure 112 including the standoff feature 113 and the frame 111 has a height $H_1$ that is less than the total stack-up height $H_2$ of the IC chip 106 (and its associated interconnection 104 pads) plus the TGF pad 108 to ensure proper engagement or contact between the TGF pad 108 and the external device 110. The TGF pad 108 needs to contact the external device 110 to dissipate the heat into the external device 110. The support structure 112 is coupled to the support board 102 so that excessive mechanical force from the external device 110 is deferred onto the support board 102 and not pressing down excessively onto the TGF pad 108 or the IC chip 106 and the interconnection 104. The support structure 112 can be made out of a rigid and insulated material such as plastic or ceramic.

Figure 5:
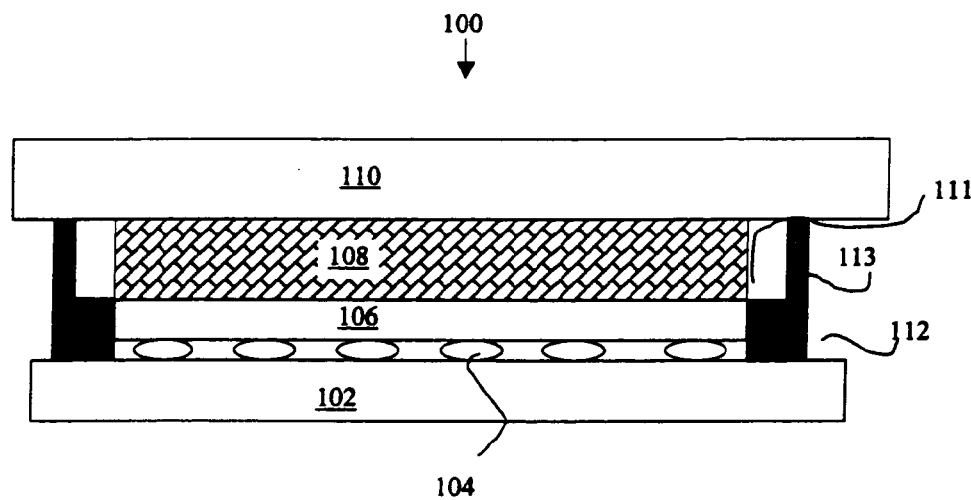
FIG. 5 illustrates a sectional view of the support structure shown in FIG. 4 limiting excessive mechanical force onto the TGF pad and the IC chip.

FIG. 5 further illustrates how the support structure 112 shown in FIG. 4 limits the mechanical force applied to the TGF pad 108 and the IC chip 106. As discussed above, the external device 110 deflects or moves down due to a force applied to the external device 110 (e.g., caused by handling, holding, mishandling), the standoff feature 113 prevents the external device 110 from applying an excessive mechanical force on the TGF pad 108 which in turns applied force on the IC chip 106. In one embodiment, the standoff feature 113 is configured to allow the TGF pad 108 to be depressed or deflected by about or less than 20% or less than 30% for an efficient heat transfer. The standoff feature 113 prevents excessive force on the TGF pad 108 and transfers such excessive force onto the support board 102. An excessive mechanical force would be a force that will cause the TGF pad 108 to deflect or depress more than optimally needed for an efficient heat transfer (e.g., more than 30%).

Figure 6:
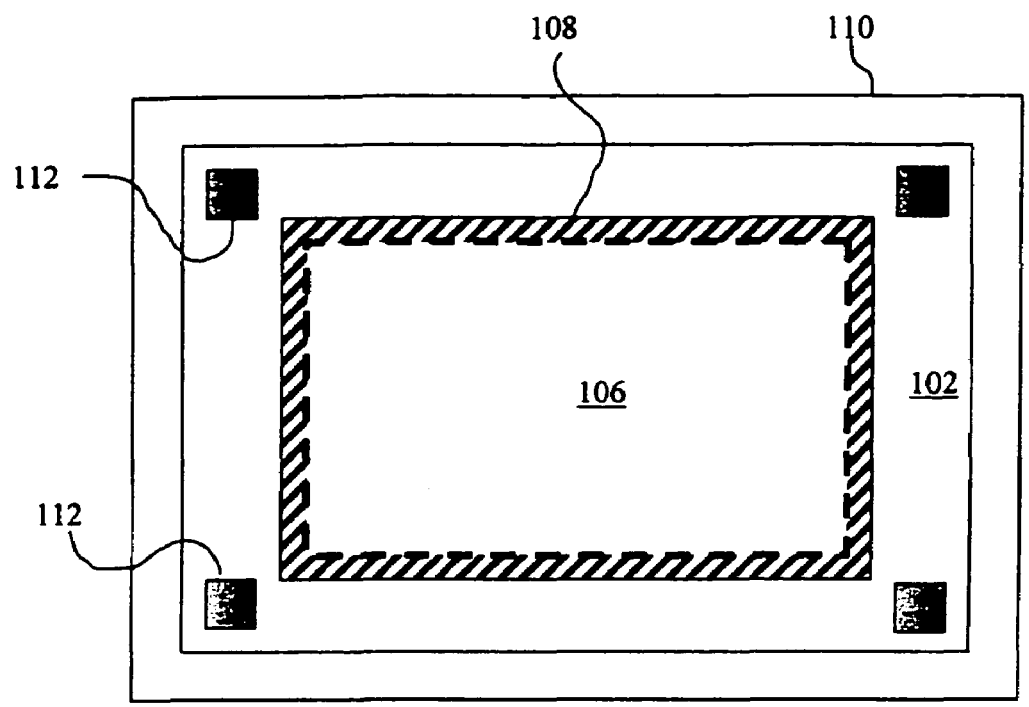
FIG. 6 illustrates a top view of one exemplary embodiment of a TGF pad coupling to an IC chip and protected by a support structure having a plurality of posts to prevent excessive mechanical force on the TGF pad and the IC chip.

FIG. 6 illustrates a top view of one exemplary embodiment of the TGF pad 108 coupling to the IC chip 106 and protected by the support structure 112. This embodiment shows the support structure 112 with a plurality of posts to prevent excessive mechanical force on the TGF pad 108 and the IC chip 106. The TGF pad 108 is shown to be adhered over one surface of the IC chip 106 and the IC chip 106 is coupled on the other surface to the support board 102. As shown in this figure, the posts are placed around the TGF pad 108 and the IC chip 106. The posts are also coupled to the support board 102 (which could be the main logic board of a computer). When the external device 110 is pressed down, its travel distance is controlled or limited by the posts and thus, excessive mechanical force is transferred onto the support board 102 protecting the TGF pad 108 and the IC chip 106 while allowing efficient heat dissipation. In an alternative embodiment of the assembly of FIG. 4, the TGF pad 108 extends well beyond the edge of IC 106 and the support structure 112 (e.g., posts) are surrounded by the TGF pad 108 in the regions of the TGF pad 108 which are beyond the edge of IC 106. The support structure 112 (e.g., posts) extend from the support board 102 and through a through hole in the TGF pad 108; the through hole allows the post to contact the external device 110 when the TGF pad is deflected down.

Figure 7:
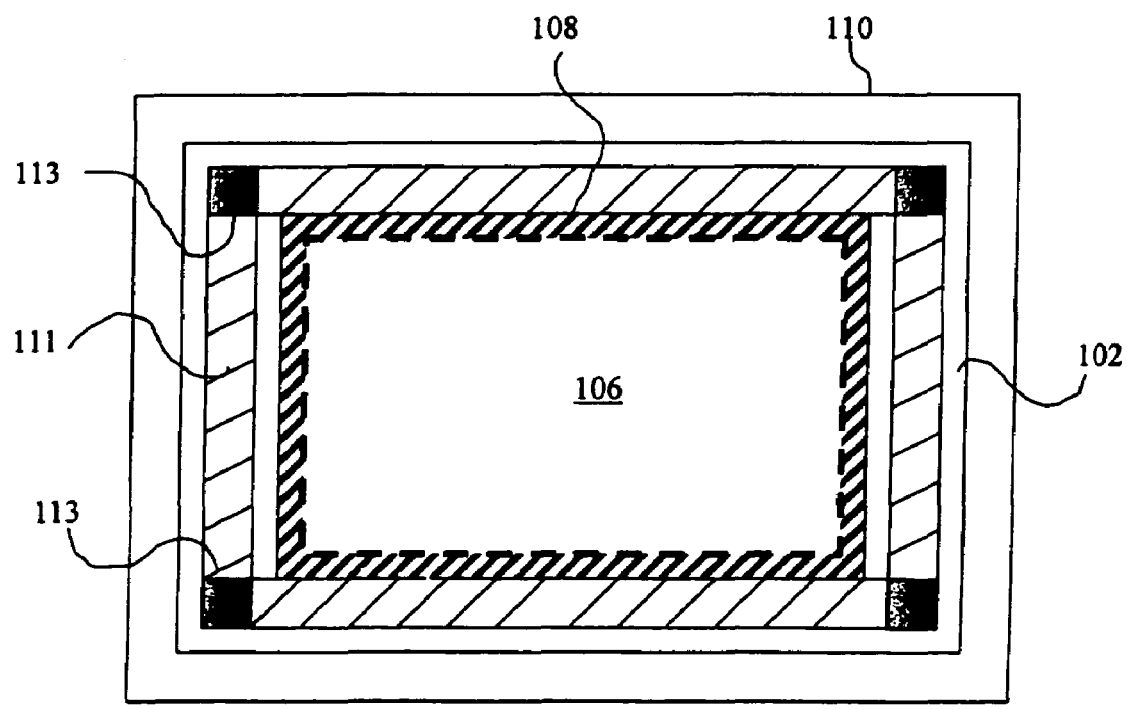
FIG. 7 illustrates a top view of one exemplary embodiment of a TGF pad coupling to an IC chip and protected by a support structure having a frame with protruding posts to prevent excessive mechanical force on the TGF pad and the IC chip.

FIG. 7 illustrates a top view of another exemplary embodiment of the TGF pad 108 coupling to the IC chip 106 and protected by a support structure that includes a frame 111 and a plurality of posts 113. The posts 113 protrude from the surface of the frame 111 (although not obvious from this view). The posts 113 prevent excessive mechanical force on the TGF pad 108 and the IC chip 106. As shown in this figure, the posts 113 are placed around the TGF pad 108 and the IC chip 106. The posts 113 are also coupled to the support board 102 (which could be the main logic board of a computer). The frame 111 is placed around the TGF pad 108 and the IC chip 106 and also provide added protection. When the external device 110 is pressed down, its travel distance is controlled or limited by the posts 113 and thus, excessive mechanical force is transferred onto the support board 102 protecting the TGF pad 108 and the IC chip 106 while allowing efficient heat dissipation.

Figure 8:
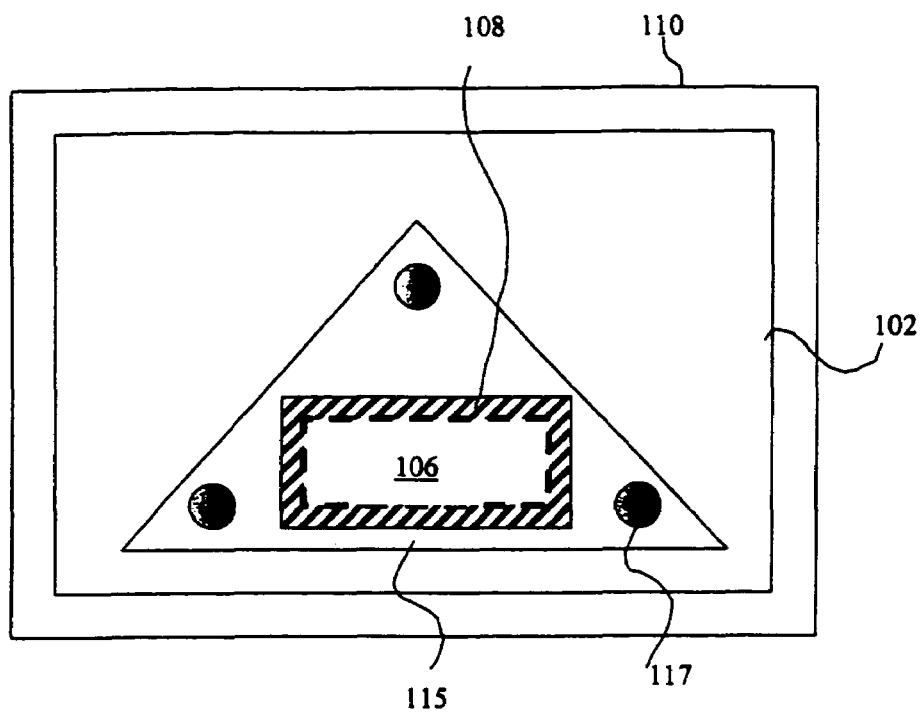
FIG. 8 illustrates a top view of another exemplary embodiment of a TGF pad coupling to an IC and protected by a support structure having a frame with protruding posts to prevent excessive mechanical force on the TGF pad and the IC chip.
Figure 9:
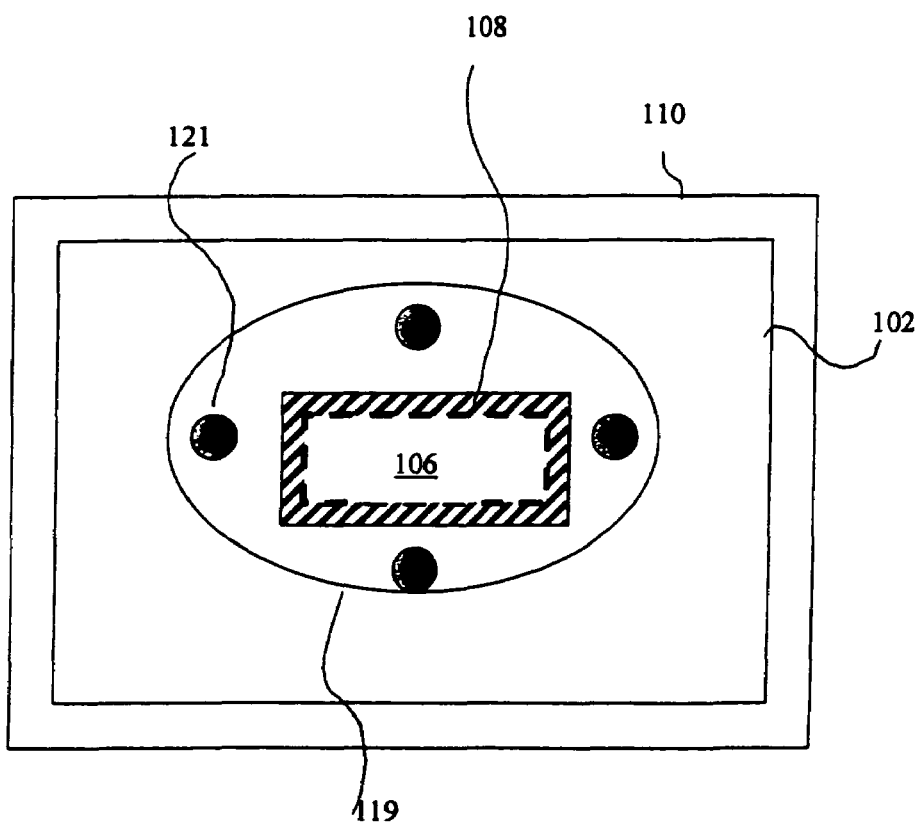
FIG. 9 illustrates a top view of another exemplary embodiment of a TGF pad coupling to an IC chip and protected by a support structure having a frame with protruding posts to prevent excessive mechanical force on the TGF pad and the IC chip.

The configuration of the support structure can be varied depending on space and other design considerations. In one embodiment, the support structure has a similar shape and size as the TGF pad 108 and/or the IC chip 106. For instance, when the IC chip 106 and the TGF pad 108 have a square or rectangular shape, the support structure can have such similar shape (square or rectangular) and/or size (dimension). In other embodiment, the support structure has other construction that may be dictated by the space limitation and design consideration of the device that the TGF pad 108 and the IC chip 106 are placed in. For instance, as shown in FIG. 8, the support structure (support structure 115) can have a construction of a triangle and includes a plurality of posts 117 placed around the TGF pad 108 and the IC chip 106. Alternatively, as shown in FIG. 9, the support structure (support structure 119) can have a circular construction and includes a plurality of posts 121 placed around the TGF pad 108 and the IC chip 106.

Figure 10:
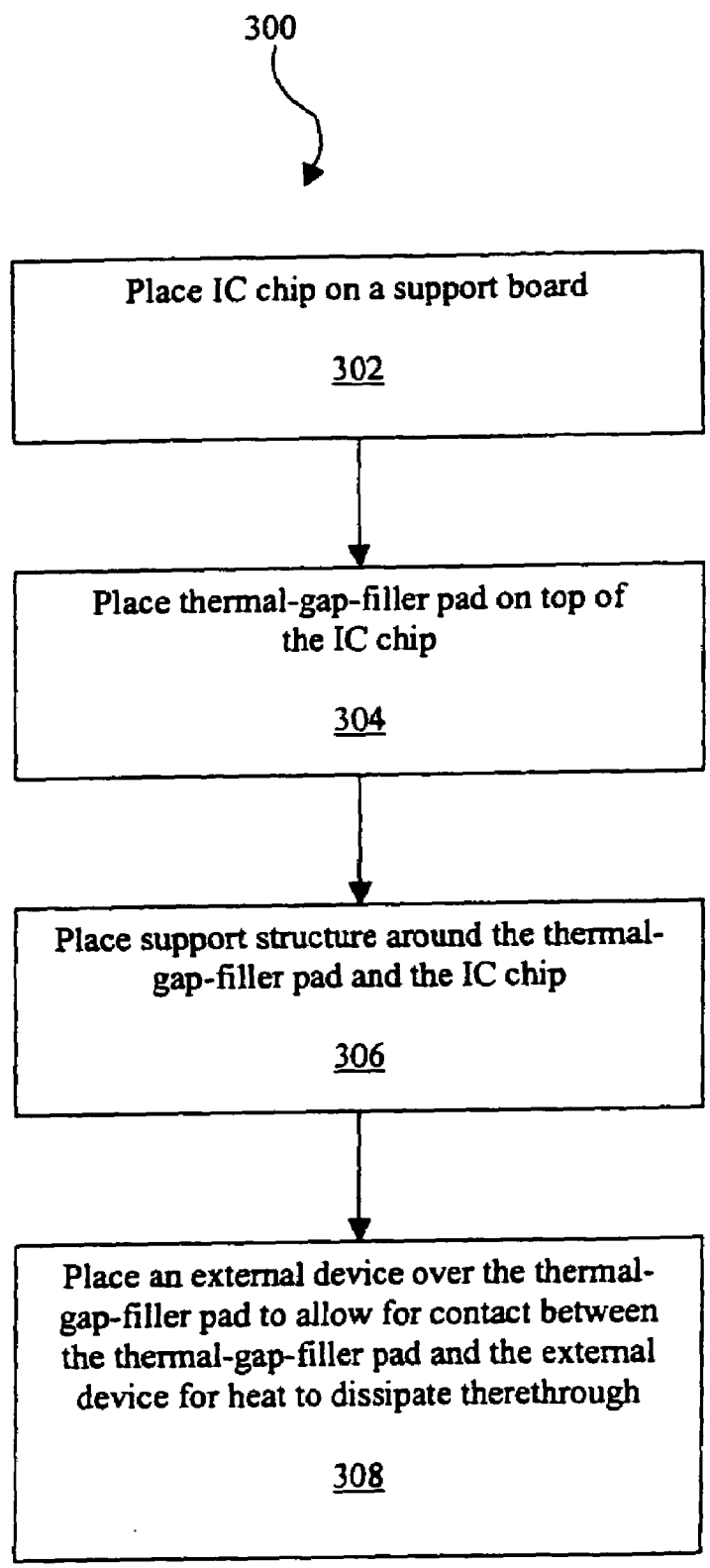
FIG. 10 illustrates an exemplary method of dissipating heat for an IC chip in accordance to embodiments of the present invention.

FIG. 10 illustrates an exemplary embodiment of a method 300 for dissipating heat generated from an integrated circuit chip such as a graphic controller chip of a notebook computer. At box 302, the IC chip is placed on a support board. In one embodiment, the support board is a computer's main logic board or motherboard. Necessary interconnections are established using conventional methods. In one embodiment, solder balls are used to create the interconnections between the support board and the IC chip. In one embodiment, the IC chip has a ball-grid-array packaging (e.g., a graphical controller chip). At box 304, a TGF pad is placed on top of the IC chip (e.g., using a conductive adhesive). At box 306, a support structure is placed around the TGF pad and the IC chip. At box 308, an external device is placed over the TGF pad. In one embodiment, the external device is an enclosure case for a notebook computer. The external device is placed over the TGF pad such that contact can be created between the TGF pad and the external device to allow heat to be dissipated therethrough. In one embodiment, the TGF pad is in an immediate contact with the external device. The support structure includes a standoff feature that can limit or prevent excessive mechanical force onto the TGF pad, the IC chip, and the associated interconnections. The support structure does not preclude contact between the TGF pad and the external device and thus, still allows for heat to transfer and dissipate through the external device.

The embodiments described herein are particularly useful for dissipating heat generated from a graphic controller chip of a notebook computer. Typically, a graphic controller chip is packaged using a ball-grid-array packaging to accommodate for the increase in density of integrated circuitry. The ball-grid-array is an arrangement that enables interconnection of high-density chips such as the graphic controller chip to a computer's main logic board. In one embodiment, the ball-grid-array utilizes many interconnection pads (e.g., solder balls) to create the interconnection from the main logic board to the graphic controller chip. In a conventional method, a thermal gap filler pad is adhered to the graphic controller chip and acts as the interface between the chip and the external enclosure case. Heat is then dissipated from the graphic controller chip to the external enclosure case via the thermal-gap-filler pad. However, it is known that there are a lot of mechanical forces applied to the notebook computer at any time. For instance, for is applied when the notebook computer is being handled or transferred. The force applied is usually excessive (more than necessary to create the contact between the thermal gap filler pad and the external device for the heat to transfer). Such force will cause cracks or damages to the interconnections between the graphic controller chip and the main logic board and disrupt the function of devices controlled by the graphic controller chip, e.g., the notebook display monitor. Thus, the embodiments of the present invention describe ways to prevent excessive force to the TFG pad, the graphic controller chip, and/or the associated interconnections by coupling a support structure to the TGF pad. The inclusion of the support structure in the heat-dissipating device that utilizes the TGF pad ensures that the mechanical force applied by the enclosure case's will not exceed the force that the TGF pad, the IC chip, and/or the interconnections can handle.

In one embodiment, a heat-dissipating device that includes the TGF pad and the support structure previously described is incorporated into a notebook computer. The notebook computer comprises a main logic board that has a plurality of interconnection contacts (e.g., solder ball or pin connections) placed thereon. An integrated circuit chip (e.g., a graphic controller chip) is coupled to the main logic board. The IC chip makes electrical and mechanical interconnection to the main logic board through the interconnection contacts. In one embodiment, the IC chip has a ball-grid-array packaging format that makes interconnection to the main logic board via a plurality of solder balls, lead wires, or other suitable electrical interconnections for high density circuit. A TGF pad is fixed to the IC chip. A support structure having a standoff feature is placed around the TGF pad and the IC chip. The support structure is coupled to the main logic board. It is to be noted that the notebook computer may comprise other internal electrical devices or components as is well known in the art. After all the internal components of the notebook computer are assembled, an enclosure case is placed over all of the internal components including the TGF pad. The TGF pad is thus situated so that it can be in contact with the enclosure case to allow heat generated from the IC chip to dissipate therethrough. The support structure is constructed so that the standoff feature limits or prevents the enclosure case from pressing down too far so as to exert excessive force on the TGF pad, the IC chip, and the associated interconnection contacts. The standoff feature allows the excessive force applied by the enclosure case (due to handling of the notebook computer) to be diverted or deferred to the main logic board which can take much more stress than the TGF pad, the IC chip, and the associated interconnection contacts.

The notebook computer also includes a display apparatus, e.g., a flat panel display, coupled to the enclosure case. In one embodiment, the display apparatus is controlled at least in part by a graphic controller chip. The graphic controller chip can be the IC chip that is coupled to the TGF pad and protected by the support structure.

The exemplary embodiments described herein are provided merely to illustrate the principles of the invention and should not be construed as limiting the scope of the subject matter of the terms of the claimed invention. The specification and drawings are, accordingly, to be regarded in an illustrative rather than a restrictive sense. Moreover, the principles of the invention may be applied to achieve the advantages described herein and to achieve other advantages or to satisfy other objectives, as well.

I claim:

1. An electronic assembly comprising:
    an integrated circuit chip;
    a heat dissipating device comprising a thermal-gap-filler pad coupled to a support structure capable of limiting force applied to the thermal-gap filler pad placed in contact with the integrated circuit chip and in contact with an external device which houses the integrated circuit chip to dissipate heat generated by the integrated circuit chip;
    wherein the support structure has a height less than a total stack-up height of the integrated circuit chip plus the thermal gap-filler pad when uncompressed.

2. The electronic assembly of claim 1 wherein the support structure includes a frame placed around the integrated circuit chip and the thermal-gap-filler pad and at least two vertical posts protruding from the frame to prevent excessive force onto the thermal-gap-filler pad.

3. The electronic assembly of claim 1 wherein the support structure includes a plurality of posts placed around the integrated circuit and the thermal-gap-filler pad to prevent excessive force onto the thermal-gap-filler pad.

4. The electronic assembly of claim 1 wherein the support structure is placed within the thermal-gap filler pad.

5. The electronic assembly of claim 1 wherein the support structure is made out of a rigid and insulated material.

6. The electronic assembly of claim 1 wherein the thermal-gap-filler pad is conductive and depressible.

7. The electronic assembly of claim 1 wherein the support structure is configured to allow the thermal-gap filler pad to be depressed by about less than 30%.

8. The electronic assembly of claim 1 wherein the integrated circuit chip is packaged in a ball-grid-array packaging format.

9. The electronic assembly of claim 1 wherein the integrated circuit chip is a graphic controller chip.

10. The electronic assembly of claim 1 further comprising a support board which is a main logic board of a computer system.

11. The electronic assembly of claim 1 further comprising a support board which is a main logic board and the integrated circuit chip is a graphic controller chip of a notebook computer.

12. The electronic assembly of claim 1 further comprising a support board which is a main logic board, the integrated circuit chip is a graphic controller chip, and the external device is an enclosure case of a notebook computer.

13. The electronic assembly of claim 1 wherein the external device is an enclosure case of a computer system.

14. A computer system comprising:
    a main logic board;
    a plurality of interconnection contacts placed on the main logic board;
    an integrated circuit chip interconnected to the main logic board and coupled to the main logic board;
    a heat dissipating device placed in contact with the integrated circuit chip and in contact with an enclosure case to dissipate heat generated by the integrated circuit chip, wherein the heat dissipating device comprising a thermal-gap-filler pad coupled to a support structure, the support structure configured to prevent excessive force being applied onto the thermal gap-filler pad and the integrated circuit chip;
    wherein the support structure has a height less than a total stack-up height of the integrated circuit chip plus the thermal gap-filler pad when uncompressed.

15. The computer system of claim 14 wherein the integrated circuit chip is a graphic controller chip.

16. The computer system of claim 15 further comprises a display apparatus coupled to the enclosure case and controlled at least in part by the graphic controller chip.

17. The computer system of claim 15 wherein the computer system is a notebook computer.

18. The electronic assembly of claim 14 wherein the support structure includes a frame placed around the integrated circuit chip and the thermal-gap-filler pad and at least two vertical posts protruding from the frame to prevent excessive force onto the thermal-gap-filler pad.

19. The electronic assembly of claim 14 wherein the support structure includes a plurality of posts placed around the integrated circuit and the thermal-gap-filler pad to prevent excessive force onto the thermal-gap-filler pad.

20. The electronic assembly of claim 14 wherein the support structure is configured to allow the thermal-gap-filler pad to be depressed by less than 30%.

21. The electronic assembly of claim 14 wherein the support structure is made out of a rigid and insulated material.

22. The electronic assembly of claim 14 wherein the thermal-gap-filler pad is conductive and depressible.

23. A heat-dissipating device for an integrated circuit chip comprising:
   a thermal-gap-filler pad constructed to be coupled to an integrated circuit on one surface of the thermal-gap-filler pad and contacted to an external device on another surface of the thermal-gap-filler pad, the thermal-gap-filler pad dissipates heat generated from the integrated circuit chip to the external device; and
   a support structure coupled to the thermal-gap-filler pad, the support structure is configured to prevent excessive force from being applied onto the thermal-gap-filler pad;
   wherein the support structure has a height less than a total stack-up height of the integrated circuit chip plus the thermal gap-filler pad when uncompressed.

24. The heat-dissipating device of claim 23 wherein the support structure is configured to allow the thermal-gap-filler pad to be deflected by less than 30%.

25. The heat-dissipating device of claim 23 wherein the support structure is made out of a rigid and insulated material.

26. The heat-dissipating device of claim 23 wherein the thermal-gap-filler pad is conductive and depressible.

27. A method to dissipate heat from an integrated circuit chip comprising:
   placing a thermal-gap-filler pad ova an integrated circuit chip;
   coupling a support structure to the thermal-gap-filler pad; and
   placing an external device over the thermal-gap-filler pad,
   wherein the support structure prevents excessive force from being applied onto the thermal-gap-filler pad while allowing sufficient contact between the thermal-gap-filler pad and the external device and the support structure has a height less than a total stack-up height of the integrated circuit chip plus the thermal gap-filler pad when uncompressed.

28. The method of claim 27 wherein the thermal-gap-filler pad is placed over the integrated circuit chip using conductive adhesive.

29. The method of claim 27 wherein the support structure is placed within the thermal-gap-filler pad.

30. The method of claim 27 wherein the integrated circuit chip is interconnected to a support board by conductive interconnections and wherein the support structure prevents excessive force to the conductive interconnections.

31. The method of 30 wherein the support board is an integrated circuit board.

32. The method of claim 27 further comprises placing a frame over the thermal-gap-filler pad to form the support structure.

33. An electronic assembly comprising:
   an integrated circuit chip;
   a heat dissipating device comprising a thermal-gap-filler pad coupled to a support structure capable of limiting force applied to the thermal-gap filler pad placed in contact with the integrated circuit chip and in contact with an external device which houses the integrated circuit chip to dissipate heat generated by the integrated circuit chip;
   wherein the support structure is configured to allow the thermal-gap filler pad to be depressed by about less than 30%.

* * * * *

UNITED STATES PATENT AND TRADEMARK OFFICE
CERTIFICATE OF CORRECTION

| | | |
|---|---|---|
| PATENT NO. | : 7,221,570 B2 | Page 1 of 1 |
| APPLICATION NO. | : 11/269961 | |
| DATED | : May 22, 2007 | |
| INVENTOR(S) | : John Mathew Depew | |

It is certified that error appears in the above-identified patent and that said Letters Patent is hereby corrected as shown below:

On the title page item (73): delete "Apple, Inc., Cupertino, CA (US)" and insert --Apple Inc., Cupertino, CA (US)--.

Signed and Sealed this

Fourteenth Day of July, 2009

JOHN DOLL
*Acting Director of the United States Patent and Trademark Office*